_(12)_ United States Patent
Tesanovic et al.

(10) Patent No.: US 11,662,541 B2
(45) Date of Patent: May 30, 2023

(54) OPTOELECTRONIC MODULES HAVING LOCKING ASSEMBLIES AND METHODS FOR MANUFACTURING THE SAME

(71) Applicant: ams Sensors Singapore Pte. Ltd., Singapore (SG)

(72) Inventors: Bojan Tesanovic, Singapore (SG); Mario Cesana, Singapore (SG); Camilla Camarri, Singapore (SG); Hartmut Rudmann, Singapore (SG)

(73) Assignee: AMS Sensors Singapore PTE. Ltd., Singapore (SG)

( * ) Notice: Subject to any disclaimer, the term of this patent is extended or adjusted under 35 U.S.C. 154(b) by 330 days.

(21) Appl. No.: 16/762,102

(22) PCT Filed: Oct. 25, 2018

(86) PCT No.: PCT/SG2018/050540
§ 371 (c)(1),
(2) Date: May 6, 2020

(87) PCT Pub. No.: WO2019/093965
PCT Pub. Date: May 16, 2019

(65) Prior Publication Data
US 2020/0355885 A1 Nov. 12, 2020

Related U.S. Application Data

(60) Provisional application No. 62/582,433, filed on Nov. 7, 2017.

(51) Int. Cl.
*H01L 33/48* (2010.01)
*G02B 7/02* (2021.01)
(Continued)

(52) U.S. Cl.
CPC ............... *G02B 7/02* (2013.01); *H01L 23/04* (2013.01); *H01L 23/3121* (2013.01); *H01L 23/3142* (2013.01); *H01L 33/483* (2013.01)

(58) Field of Classification Search
CPC .. H01L 23/04; H01L 23/3121; H01L 23/3142
See application file for complete search history.

(56) References Cited

U.S. PATENT DOCUMENTS 5,274,456 A * 12/1993 Izumi .................. H04N 5/2254
348/E3.019
6,686,588 B1 2/2004 Webster et al.
(Continued)

FOREIGN PATENT DOCUMENTS

FR          2835654 A1    8/2003
TW       201709491 A     3/2017
(Continued)

OTHER PUBLICATIONS

Office Action for TW patent application No. 107139264 with Search Report, dated May 24, 2022, 4 pages.
(Continued)

*Primary Examiner* — Eugene Lee
(74) *Attorney, Agent, or Firm* — Kilpatrick Townsend & Stockton LLP

(57) ABSTRACT

This disclosure describes optoelectronic modules with locking assemblies and methods for manufacturing the same. The locking assemblies, in some instances, can improve mounting steps during manufacturing and can increase the useful lifetime of the optoelectronic modules into which they are incorporated. The locking assemblies can include overmold protrusions, and optical element housing protrusions, as well as locking edges incorporated into overmold housing components.

13 Claims, 5 Drawing Sheets

(51) Int. Cl.
*H01L 23/04* (2006.01)
*H01L 23/31* (2006.01)

(56) References Cited

U.S. PATENT DOCUMENTS

| | | | | |
|---|---|---|---|---|
| 7,342,215 | B2* | 3/2008 | Webster | H01L 27/14625 |
| | | | | 250/239 |
| 7,880,796 | B2* | 2/2011 | Yamaguchi | G02B 13/003 |
| | | | | 348/340 |
| 2001/0012073 | A1* | 8/2001 | Toyoda | H01L 27/14618 |
| | | | | 348/340 |
| 2004/0022502 | A1* | 2/2004 | Zhou | H01S 5/02253 |
| | | | | 385/94 |
| 2004/0080642 | A1 | 4/2004 | Kobayashi et al. | |
| 2004/0109079 | A1* | 6/2004 | Fujimoto | H04N 5/2254 |
| | | | | 348/340 |
| 2004/0251509 | A1 | 12/2004 | Choi | |
| 2006/0202293 | A1* | 9/2006 | Bogdan | H01L 27/14618 |
| | | | | 257/E31.127 |
| 2007/0114553 | A1* | 5/2007 | Nagasaka | H01L 31/02325 |
| | | | | 257/E31.127 |
| 2007/0170449 | A1* | 7/2007 | Anandan | G01J 3/50 |
| | | | | 257/E25.032 |
| 2008/0218623 | A1* | 9/2008 | Lo | G03B 13/00 |
| | | | | 348/E7.091 |
| 2009/0256229 | A1 | 10/2009 | Ishikawa et al. | |
| 2011/0051390 | A1* | 3/2011 | Lin | H04N 5/2257 |
| | | | | 361/818 |
| 2015/0034975 | A1* | 2/2015 | Rudmann | H01L 31/0203 |
| | | | | 257/82 |
| 2016/0218239 | A1 | 7/2016 | Gubser et al. | |
| 2016/0219203 | A1 | 7/2016 | Wan et al. | |
| 2017/0351049 | A1* | 12/2017 | Yong | G01J 1/0271 |
| 2018/0329175 | A1* | 11/2018 | Wang | G02B 13/0085 |
| 2019/0123213 | A1* | 4/2019 | Yu | H01L 31/0203 |

FOREIGN PATENT DOCUMENTS

| | | |
|---|---|---|
| WO | 2017007425 A1 | 1/2017 |
| WO | 20170086878 A1 | 5/2017 |
| WO | 2017/157015 A1 | 9/2017 |

OTHER PUBLICATIONS

PCT/SG2018/050540 International Search Report and Written Opinion, dated Jan. 21, 2019, 10 pages.
Extended European Search Report for related application, European Patent Application No. 18875232.3, dated Aug. 3, 2021, 11 pages.

* cited by examiner

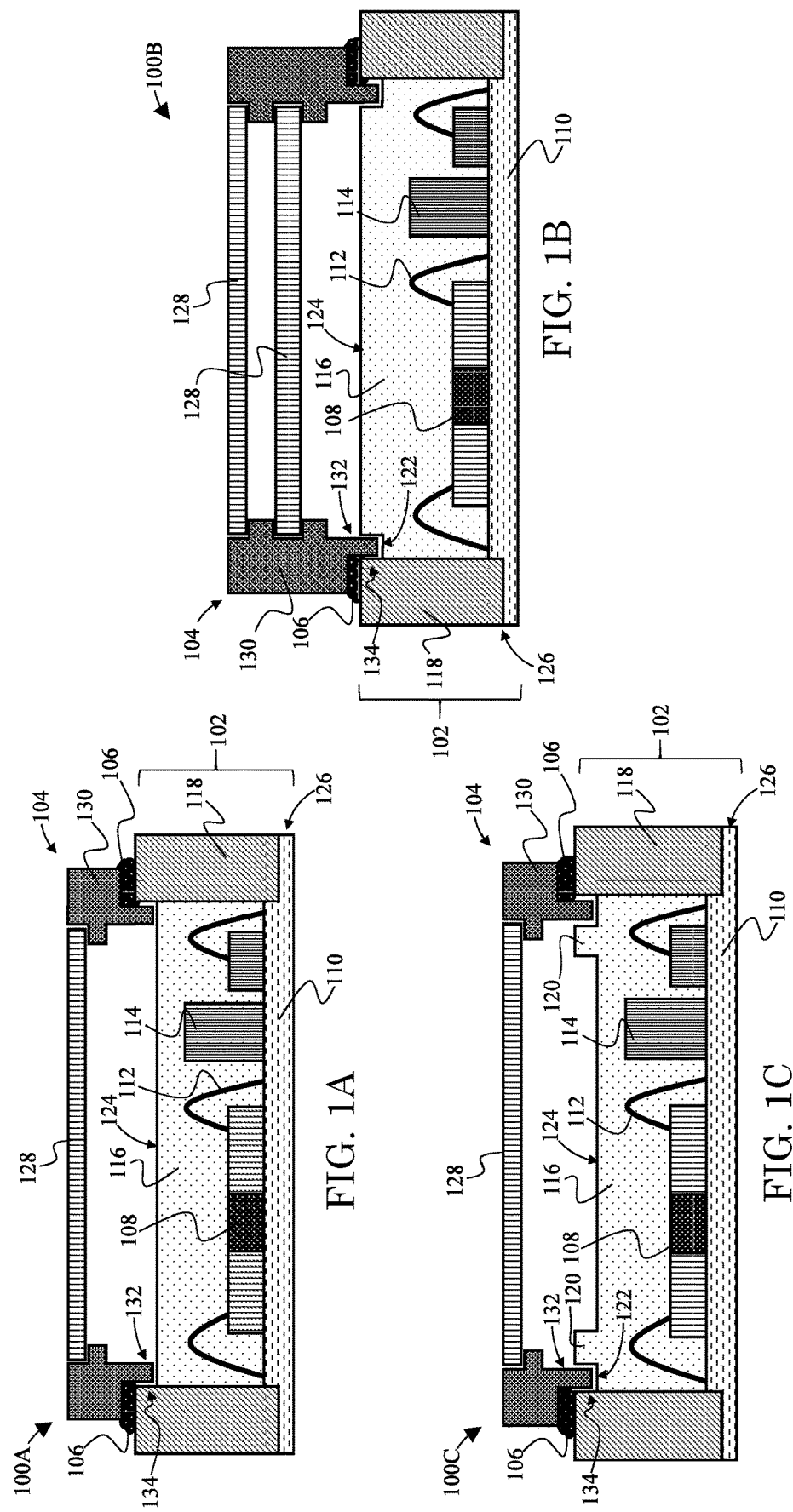

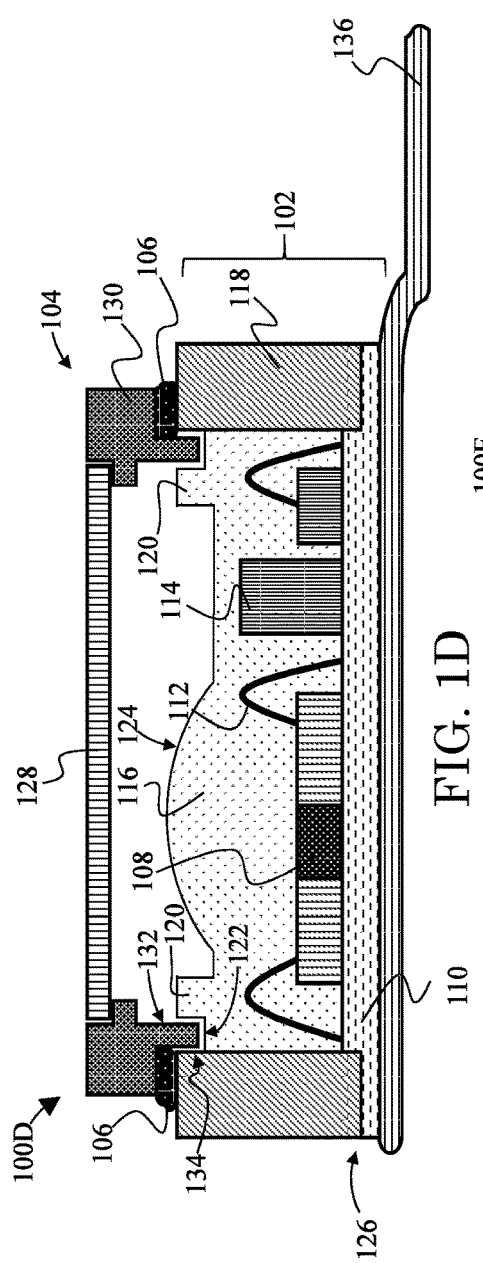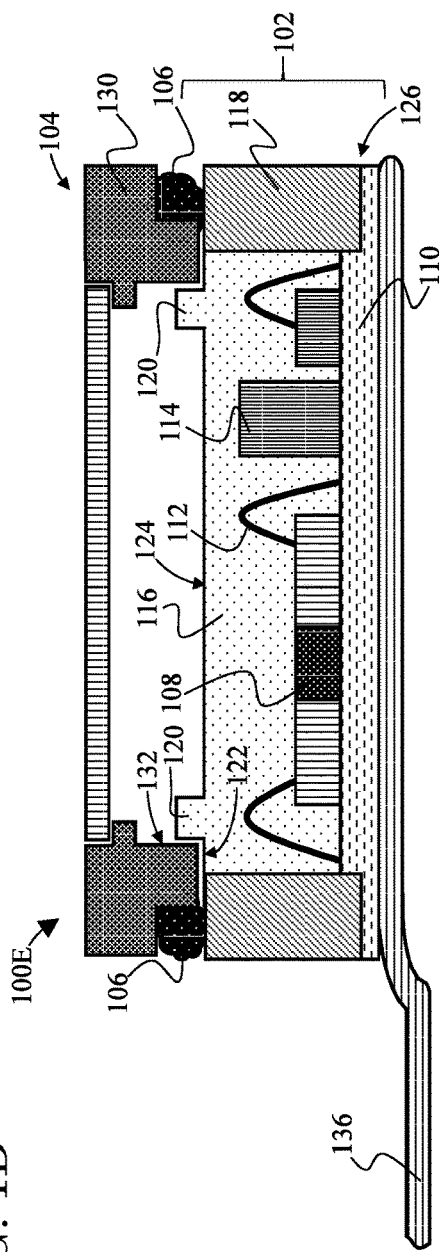
FIG. 1D
FIG. 1E

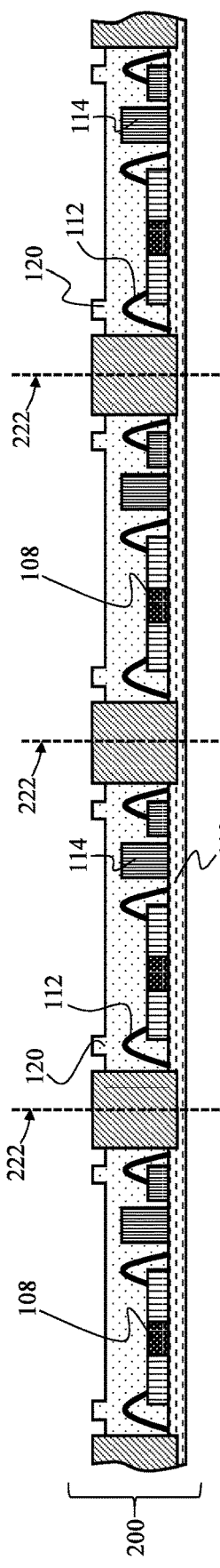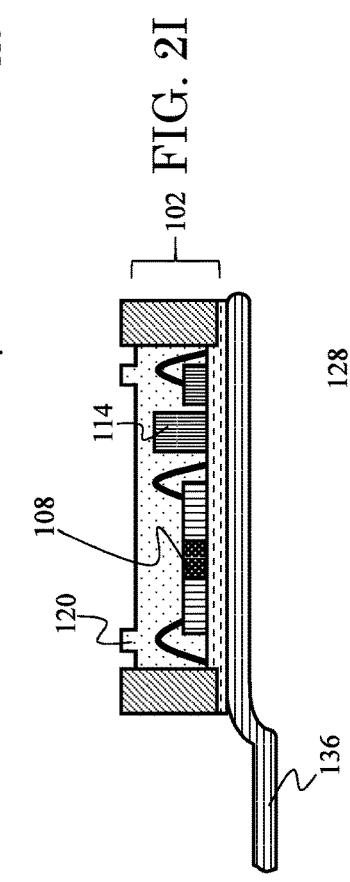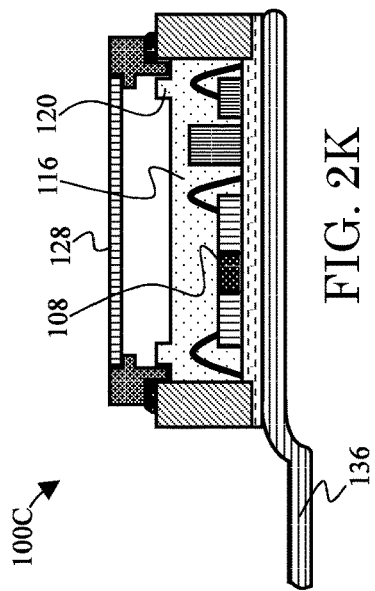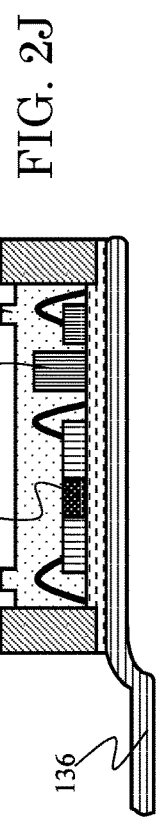

OPTOELECTRONIC MODULES HAVING LOCKING ASSEMBLIES AND METHODS FOR MANUFACTURING THE SAME

CROSS-REFERENCE TO RELATED APPLICATIONS

This application is a 371 U.S. National Phase of PCT International Patent Application No. PCT/SG2018/050540, filed on Oct. 25, 2018, which claims benefit and priority to U.S. provisional patent application No. 62/582,433, filed on Nov. 7, 2017, the disclosures of which are each incorporated by reference herein in their entirety.

FIELD OF THE DISCLOSURE

The present disclosure relates to optoelectronic modules having locking assemblies and methods for manufacturing such modules.

BACKGROUND

An optoelectronic module, such as a proximity sensor, a structured-light generator, a two- or three-dimensional imaging camera, or an ambient light sensor, typically includes an optical assembly mounted to an optoelectronic component, such as a light emitting diode, a photodiode, a laser diode, or an imaging sensor. Mounting (i.e., involving the alignment and joining of these components) can be a challenge. Moreover, the useful lifetime of an optoelectronic module can be significantly reduced when an optical assembly becomes misaligned relative to a corresponding optoelectronic component during normal use. Consequently, a need for optoelectronic modules with improved mounting technology, and their manufacture, is needed.

SUMMARY

This disclosure describes optoelectronic modules having locking assemblies and methods for manufacturing the same. The locking assemblies can, in some cases, improve mounting steps during manufacturing and can increase the useful lifetime of the optoelectronic modules into which they are incorporated. In a first aspect, for example, an optoelectronic module includes an optical element assembly. The optical element assembly includes an optical element mounted within an optical element housing. The optoelectronic module further includes an overmold assembly. The overmold assembly includes an optoelectronic component mounted to a substrate via electrical connections. The optoelectronic component and electrical connections are encapsulated by an overmold and the overmold is laterally circumscribed by an overmold housing. The optical element assembly is mounted to the overmold assembly via a locking assembly such that lateral movement of the optical element assembly relative to the overmold assembly is substantially restrained.

In another aspect, the present disclosure describes a method for manufacturing optoelectronic modules having locking assemblies. The method includes:
constructing a wafer assembly, the wafer assembly being constructed in part by mounting a plurality of optoelectronic components to a substrate with electrical connections;
mounting an overmold tool to the wafer assembly, the overmold tool including a plurality of overmold tool channels and a plurality of overmold tool trenches;
introducing a formable overmold material into the wafer assembly via the plurality of overmold tool channels such that the plurality of optoelectronic components and electrical connections are encapsulated and the plurality of overmold tool trenches are at least partially filled with formable overmold material;
curing the formable overmold material such that the formable overmold material is substantially solid; removing the overmold tool from the wafer assembly;
dicing into the overmold and substrate such that a plurality of module trenches is formed;
mounting a housing tool to the wafer assembly, the housing tool including a plurality of housing tool channels and a plurality of housing tool protrusions;
introducing a formable housing material into the wafer assembly via the plurality of housing tool channels such that the module trenches are at least partially filled with formable housing material;
curing the formable housing material such that the formable housing material is substantially solid; removing the housing tool from the wafer assembly; and
dicing though the substantially solid housing material generating a plurality of discrete overmold assemblies.

Other aspects, features and advantages will be readily apparent from the following detailed description, the accompanying drawings, and the claims.

BRIEF DESCRIPTION OF THE DRAWINGS

FIG. 1A-FIG. 1E depict example optoelectronic modules having locking assemblies.

FIG. 2A-FIG. 2K depict an example method for manufacturing optoelectronic modules having locking assemblies.

DETAILED DESCRIPTION

Figure 2A:
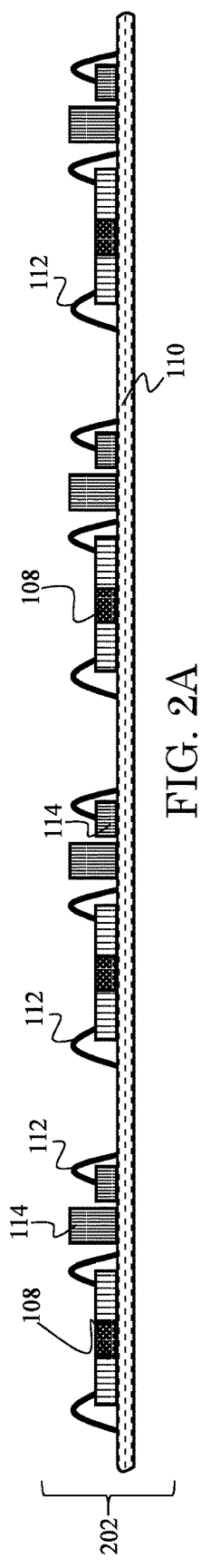

Examples of optoelectronic modules 100A-100E are depicted in FIG. 1A-FIG. 1E, respectively. Each example optoelectronic module includes a locking assembly. The locking assembly improves mounting steps during manufacturing and increases the useful lifetime of the optoelectronic modules into which they are incorporated. Common reference numerals indicate similar features.

Each of the optoelectronic modules 100A-100E includes an overmold assembly 102 and an optical element assembly 104. The optical element assembly 104 can be mounted to the overmold assembly 102 via adhesive 106. The overmold assembly includes an optoelectronic component 108 mounted to a substrate 110 (e.g., printed circuit board) via electrical connections 112 (e.g., wire bonds). Still other electrical components 114 (e.g., capacitors) can be mounted to the substrate 110 via the electrical connections 112.

The overmold assembly 102 further includes an overmold 116. The overmold 116, together with the substrate 110, encapsulates the optoelectronic component 108, the electrical connections 112, and any other electrical components 114 (if present). The overmold assembly 102 further includes an overmold housing 118 circumscribing the overmold 116. The overmold 116 can include overmold protrusions 120 and an overmold trench 122 both incorporated into a first side 124 of the overmold 116. In some instances, the overmold assembly 102 can include a substrate trench 126 (i.e., a trench incised or otherwise formed in the substrate 110). When present, the overmold housing 118 can extend into the substrate trench 126. In some instances, the substrate trench 126 can improve mechanical robustness of the optoelectronic modules 100A and/or can eliminate stray light from passing between the substrate 110 and the overmold housing 118. Further, in some instances, the first side 124 of the overmold 116 can include one or more optical elements. For example, an optical element, such as an optical filter, could be coated onto the first side 124. In some instances, an optical element can be formed into the first side 124 of the overmold 116 as depicted din FIG. 1D.

The optical element assembly 104 includes an optical element 128 mounted within an optical element housing 130. The optical element 128 can include a refractive lens, a diffractive lens, a microlens array, a diffuser, other diffractive elements, an optical filter (e.g., an infrared filter), or any combination of the aforementioned. The optical element assembly 104 further includes an optical element housing protrusion 132 extending form the optical element housing 130. Both the optical element housing 130 and the optical element housing 132 can be composed, at least partially, of cured epoxy. In some instances, the optical element housing protrusion 132 and the optical element housing 130 can be formed at the same time and can be materially contiguous, though they need not be. In some instances, they can be formed separately and mounted together with adhesive, for example. In some instances, the overmold housing 118 can include a locking edge 134 configured to engage with the optical element housing protrusion 132 (as depicted in FIG. 1A-FIG. 1D). The optoelectronic modules 100A-100E can be mounted onto a flex cable 136 (not depicted in FIG. 1A-FIG. 1C for clarity).

Figure 2B:
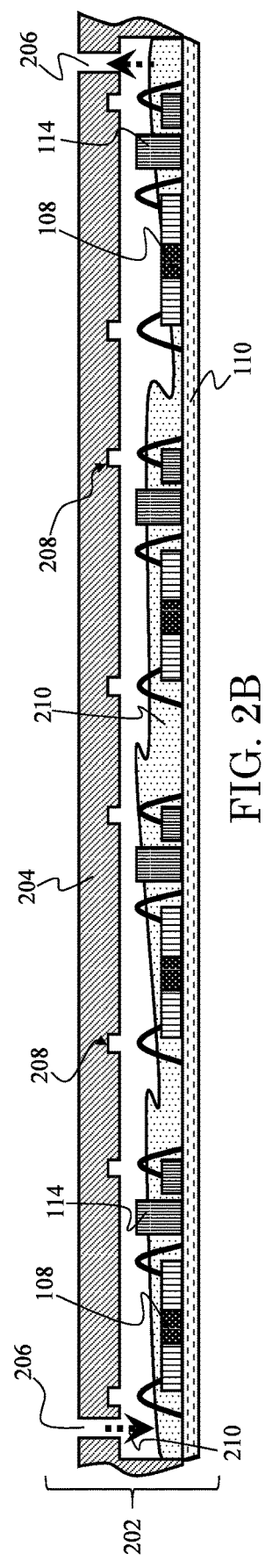

FIG. 2A-FIG. 2K depict an example of a method for manufacturing optoelectronic modules having locking assemblies, such as the optoelectronic modules 100A-100E depicted in FIG. 1A-FIG. 1E, respectively. In a step, a wafer assembly 202 is constructed. The wafer assembly 202 can include various films and mounting components as would be apparent to a person of ordinary skill in the art. For example, the wafer assembly 202 can be mounted to a vacuum chuck during various steps of the example manufacturing method. The wafer assembly 202 is constructed in part by mounting a plurality of optoelectronic components 108 to the substrate 110 via the electrical connections 112 as depicted in FIG. 2A. In another step, an overmold tool 204 is mounted to the wafer assembly 202. The overmold tool 204 includes a plurality of overmold tool channels 206 and a plurality of overmold tool trenches 206 as depicted in FIG. 2B.

Figure 2C:
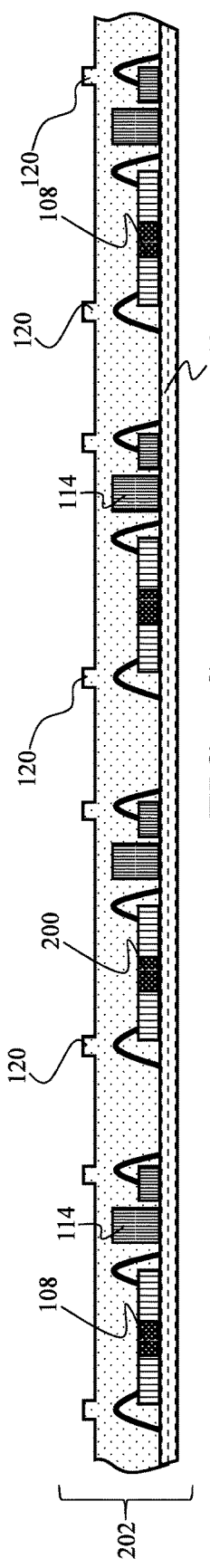
Figure 2D:
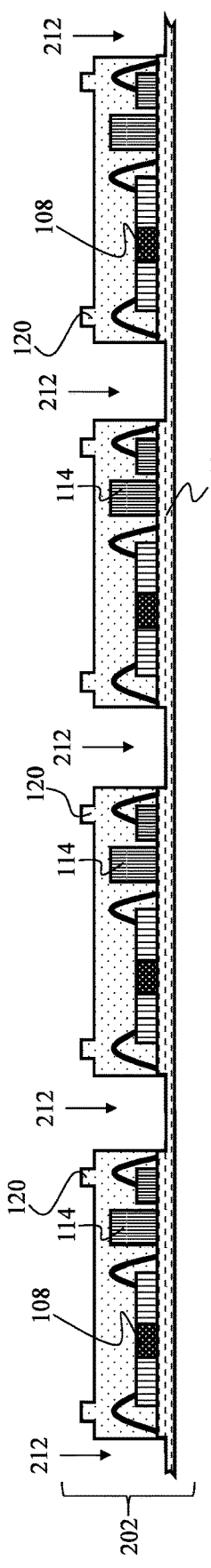

In another step, a formable overmold material 210 is introduced into the wafer assembly 202 via the plurality of overmold tool channels 206 such that the plurality of optoelectronic components 108 and electrical connections 112 (and in some instances other electrical components 114) are encapsulated and the plurality of overmold tool trenches 208 are at least partially filled with the formable overmold material 210 as further depicted in FIG. 2B. The formable overmold material 210 is then cured in a subsequent step with electromagnetic radiation (e.g., infrared or ultraviolet light) and/or thermal energy such that the formable overmold material 210 is substantially solid. The overmold tool 204 is then removed from the wafer assembly 202 in a subsequent step as depicted in FIG. 2C.

In another step, the overmold 116 and substrate 110 are dice into such that a plurality of module trenches 212 is formed. In some instances, only the overmold 116 is diced into. In another step, a housing tool 214 is mounted to the wafer assembly 202. The housing tool 214 includes a plurality of housing tool channels 216 and a plurality of housing tool protrusions 218. In another step, a formable housing material 220 is introduced into the wafer assembly 202 via the plurality of housing tool channels 216 such that the module trenches 212 are at least partially filled with formable housing material 220 as depicted in FIG. 2E.

Figure 2E:
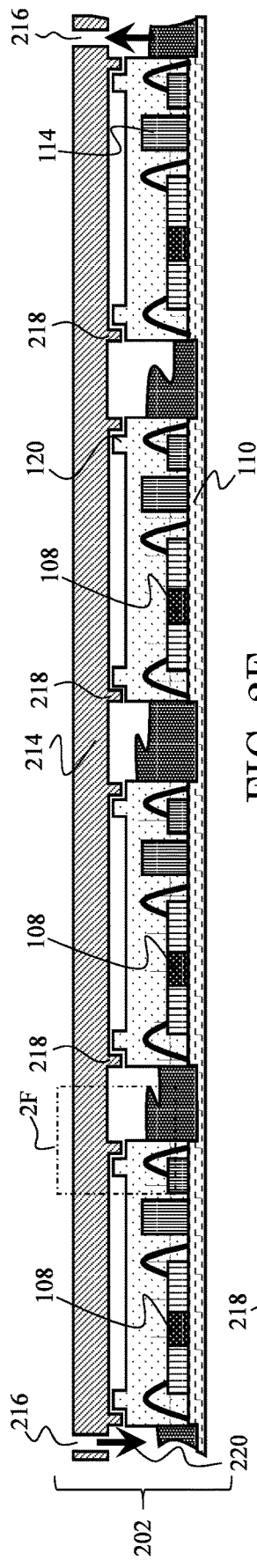
Figure 2F:

FIG. 2F depicts an enlarged portion of FIG. 2E. In some instances, as depicted in FIG. 2E and FIG. 2F, the housing tool 214 does not make contact with the overmold protrusion 120. Rather, in some instances as depicted, the housing tool 214 (via the housing tool protrusion 218) makes contact with a small portion of the first side 124 of the overmold 116. In some instances, such a feature can prevent formable housing material 220 from migrating onto a large portion of the first side 124 of the overmold 116.

Figure 2G:
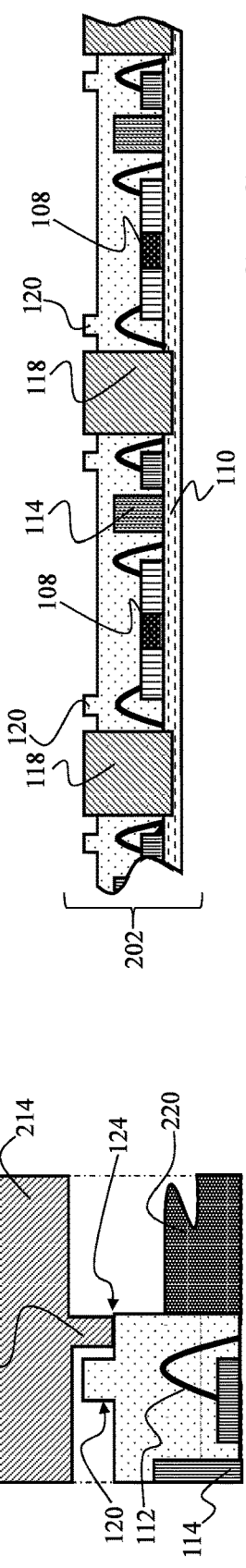

In another step, the formable housing material 220 is cured with electromagnetic radiation and/or thermal energy such that the formable housing material 220 is substantially solid. In another step, the housing tool 214 is removed from the wafer assembly 202 as depicted in FIG. 2G. In another step, the substantially solid housing material is diced through along dicing lines 222 (FIG. 2H) generating a plurality of discrete overmold assemblies 202 as depicted in FIG. 2I. In some instances, the overmold assembly 202 can be mounted to the flex cable 136; e.g., the optoelectronic component 108 can be electrically connected to the flex cable 136.

In another step, as depicted in FIG. 2J, the optical element assembly 104 is mounted to the overmold assembly 102 via adhesive and components of a locking assembly described above (e.g., overmold protrusions 120 and optical element protrusions 132). In some instances, the adhesive can be partially or fully cured (e.g., with electromagnetic radiation and/or thermal energy), though need not be. In another step, the performance of the assembled optoelectronic module, 100C as depicted in FIG. 2K, can be evaluated. The optoelectronic components 108, for example, can be activated via the flex cable 136 and tested for performance, efficiency and so on.

Some of the aforementioned implementations describe a collection of steps for manufacturing pluralities of discrete optoelectronic modules. Various steps are described sequentially, though steps need not occur in the sequence described. Moreover, steps described sequentially may be carried out simultaneously. Further, the example steps described above can be repeated in some instances. Further, modifications can be made to the foregoing implementations, for example additional steps, such as steps involving the application of a releasing agent and steps involving oxygen plasma treatments, can be included in any of the aforementioned implementations.

Moreover, some of the aforementioned implementations describe discrete optoelectronic modules. Modifications can be made to the foregoing implementations; for example, any of the above implementation can include an aperture (e.g., at least partially composed of black chrome) mounted or deposited onto any of the optical elements 128 (e.g., via photolithographic techniques, screen printing, and so forth). Still further, features described above in different implementations may be combined in the same implementations.

Thus, other implementations are within the scope of the claims.

What is claimed is:

1. An optoelectronic module comprising:
   an optical element assembly including an optical element mounted within an optical element housing;
   an overmold assembly, the overmold assembly including an optoelectronic component mounted to a substrate via electrical connections, the optoelectronic component and electrical connections being encapsulated by an overmold and the overmold being laterally circumscribed by an overmold housing; and the optical element assembly being mounted to the overmold assembly via a locking assembly such that lateral movement of the optical element assembly relative to the overmold assembly is substantially restrained wherein the locking assembly includes an optical element housing protrusion extending from the optical element housing, the optical element housing protrusion being in contact with a first side of the overmold.

2. The optoelectronic module of claim 1, wherein the optoelectronic component is operable to sense and/or emit a particular wavelength of electromagnetic radiation.

3. The optoelectronic module of claim 2, wherein the overmold assembly housing is substantially transparent to the particular wavelength and the optical element housing is substantially non-transparent to the particular wavelength.

4. The optoelectronic module of claim 3, wherein the optical element includes a diffuser, a refractive optical element, a diffractive optical element, a microlens array, and/or an optical filter.

5. The optoelectronic module of claim 1, further including the optical element housing being in contact with the overmold housing via adhesive.

6. The optoelectronic module of claim 5, wherein the locking assembly includes a locking edge incorporated into the overmold housing, the locking edge being disposed adjacent to the optical element housing protrusion and being configured to substantially restrain lateral movement of the optical element assembly relative to the overmold assembly.

7. The optoelectronic module of claim 5, wherein the locking assembly includes:

a locking edge incorporated into the overmold housing, the locking edge being disposed adjacent to the optical element housing protrusion and being configured to substantially restrain lateral movement of the optical element assembly relative to the overmold assembly; and an overmold trench disposed within the first side of the overmold, the optical element housing protrusion being in contact with the first side of the overmold via the overmold trench, the overmold trench being configured, together with the locking edge, to substantially restrain lateral movement of the optical element assembly relative to the overmold assembly.

8. The optoelectronic module of claim 7, wherein the locking assembly includes an overmold protrusion extending from the first side of the overmold, the overmold protrusion, together with the overmold trench and locking edge, to substantially restrain lateral movement of the optical element assembly relative to the overmold assembly.

9. The optoelectronic module of claim 8, further including the overmold protrusion being configured to substantially block the migration of the adhesive onto the first side of the overmold.

10. The optoelectronic module of claim 1, in which the overmold housing extends into the substrate.

11. The optoelectronic module of claim 1, in which the first side of the overmold can include an optical element.

12. The optoelectronic module of claim 11, wherein the optical element can be formed into the first side of the overmold.

13. The optoelectronic module of claim 1, in which the optoelectronic component includes an edge-emitting laser diode, a vertical-cavity surface-emitting laser, a light-emitting diode, a photodiode, a demodulation pixel, and/or an image sensor.

* * * * *

UNITED STATES PATENT AND TRADEMARK OFFICE
CERTIFICATE OF CORRECTION

PATENT NO. : 11,662,541 B2
APPLICATION NO. : 16/762102
DATED : May 30, 2023
INVENTOR(S) : Bojan Tesanovic et al.

It is certified that error appears in the above-identified patent and that said Letters Patent is hereby corrected as shown below:

In the Claims

In Claim 1, Column 5, Line 1:
Delete "laterally"

Signed and Sealed this
Second Day of April, 2024

Katherine Kelly Vidal
*Director of the United States Patent and Trademark Office*